United States Patent [19]
Benner

[11] Patent Number: 5,483,073
[45] Date of Patent: Jan. 9, 1996

[54] METHOD OF ILLUMINATING AN OBJECT WITH A FOCUSED ELECTRON BEAM AND AN ELECTRON-OPTICAL ILLUMINATING SYSTEM THEREFOR

[75] Inventor: Gerd Benner, Aalen, Germany

[73] Assignee: Carl-Zeiss-Stiftung, Heidenheim, Germany

[21] Appl. No.: 172,122

[22] Filed: Dec. 22, 1993

[30] Foreign Application Priority Data

Dec. 22, 1992 [DE] Germany .................. 42 43 489.0

[51] Int. Cl.⁶ .................................................. H01J 37/147
[52] U.S. Cl. .................... 250/311; 250/307; 250/396 R
[58] Field of Search ................ 250/396 R, 396 ML, 250/492.23, 311, 307

[56] References Cited

U.S. PATENT DOCUMENTS

| | | | |
|---|---|---|---|
| 3,715,582 | 2/1973 | Akahori et al. | 250/311 |
| 3,876,883 | 4/1975 | Bruers | 250/492.23 |
| 4,140,913 | 2/1979 | Anger et al. | 250/398 |
| 4,547,669 | 10/1985 | Nakagawa et al. | 250/310 |
| 4,626,689 | 12/1986 | Tomita et al. | 250/396 R |
| 5,013,913 | 5/1991 | Benner | 250/307 |
| 5,051,556 | 9/1991 | Sakamoto et al. | 250/396 ML |

FOREIGN PATENT DOCUMENTS

| | | |
|---|---|---|
| 0367496 | 5/1990 | European Pat. Off. . |
| 0179294 | 4/1986 | WIPO . |

*Primary Examiner*—Bruce C. Anderson
*Attorney, Agent, or Firm*—Walter Ottesen

[57] ABSTRACT

The invention is directed to a method for illuminating an object with a focused electron beam as well as to an electron-optical illuminating apparatus therefor. The crossover of an electron source is imaged, greatly demagnified, into the object plane via four imaging stages. The two first condenser stages define a zoom system. The cross section of the crossover image in the input image plane of the third condenser stage can be varied by varying the corresponding lens excitation. The third condenser stage images the crossover image from the input image plane into the input image plane of the objective. A multiple diaphragm is mounted between the third condenser stage and the input image plane of the objective. This multiple diaphragm has several apertures which are, in part, off-axis. The electron beam can be deflected by magnetic deflecting systems in such a manner that only the electron beam, which is transmitted through one diaphragm aperture of the multiple diaphragm, contributes an amount to the illumination of the object. In this way, the aperture of the illuminating beam component can be varied independently of the imaging scale with which the crossover is imaged on the object.

15 Claims, 4 Drawing Sheets

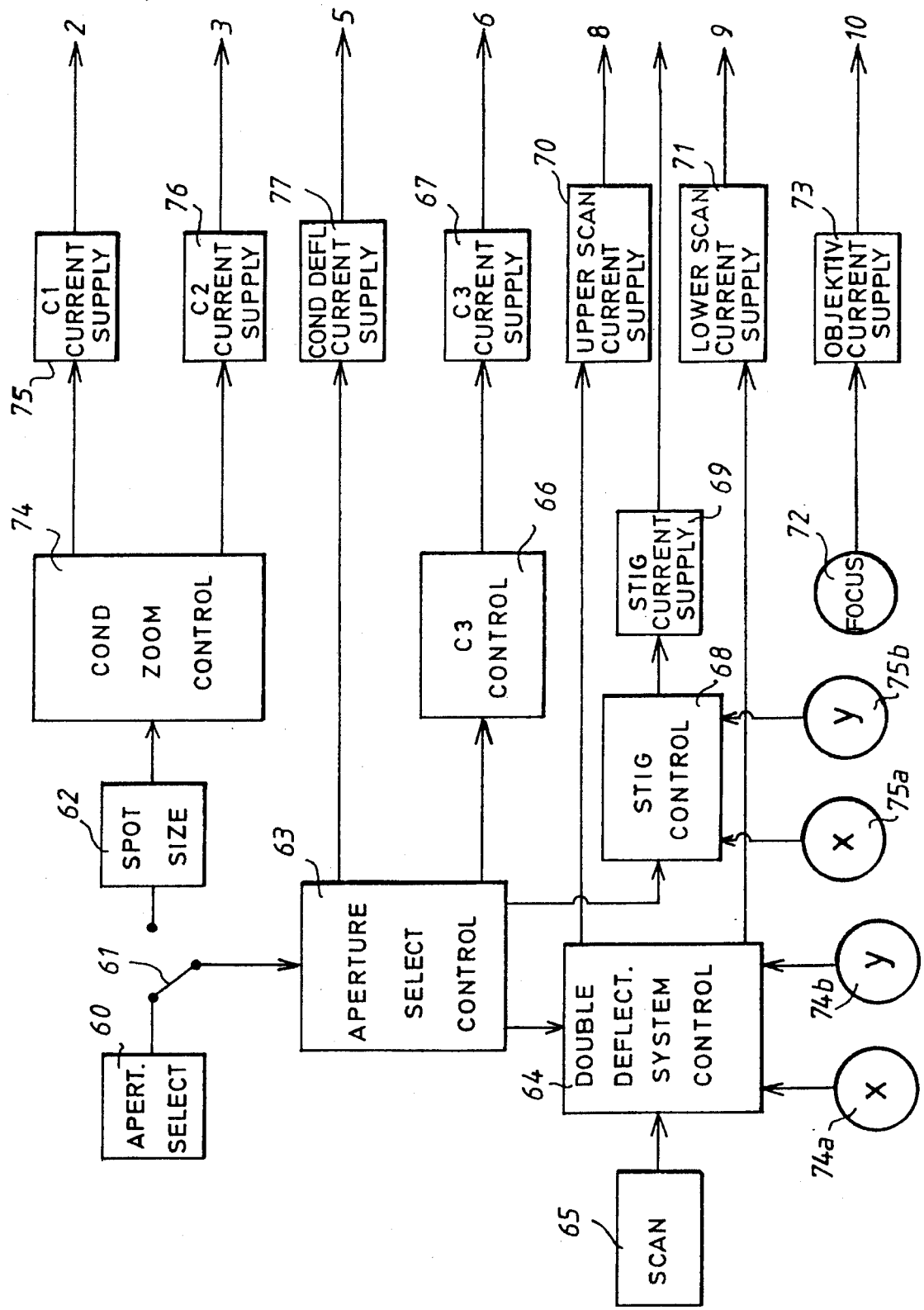

METHOD OF ILLUMINATING AN OBJECT WITH A FOCUSED ELECTRON BEAM AND AN ELECTRON-OPTICAL ILLUMINATING SYSTEM THEREFOR

BACKGROUND OF THE INVENTION

Focused electron beams having a very small focus diameter are used in electron microscopy for generating raster microscopic images of surfaces as well as for generating raster microscopic images of objects which can be transilluminated. In addition, applications for analyzing materials are known such as by means of X-rays generated by the electron beam in the object. Applications are also known in the energy-loss spectroscopy and for three-dimensional structural analysis by convergent diffraction.

The focus diameter of the electron beam on the object is generally defined by the demagnified image of the crossover of the electron source with the aid of several condenser lenses and one objective lens. The aperture of the electron beam is adjusted by a condenser diaphragm. In order to obtain a maximum electron current for a desired probe diameter, the aperture is so selected that no significant widening of the electron probe takes place because of the aperture aberration of the illuminating system. The aperture aberration, especially of the objective lens of a scanning electron microscope, therefore requires an adaptation of the probe aperture to the selected focus diameter.

The convergent diffraction is a microdiffraction method wherein the focus of the electron beam is fixed on the object. A variable adjustment of the aperture (that is, of the angle of convergency) is required for adapting the angle of convergency to the Bragg angle of the crystal and for adjusting different diffraction diagrams (such as the Kossel diagram or Kossel-Mollenstedt diagram).

U.S. Pat. No. 4,626,689 discloses an electron microscope illuminating system wherein the crossover of the electron source is focused on the object via a three-stage condenser and a further electron lens. The third condenser stage is only weakly excited and generates only an imaginary image. The excitations of the four lenses are so selected that different convergence angles can be set with only a single fixed condenser diaphragm with the focus diameter being constant. However, it has been shown that the simultaneous setting of a constant focus diameter and a variable aperture greatly limits the range of variation of the aperture. Even a variation of the aperture by a factor of 1.5 to 2 requires a mechanical exchange of the condenser diaphragm in dependence upon the selection of the diaphragm diameter. This requires a recentering of the diaphragm which has been mounted in exchange.

U.S. Pat. No. 5,013,913 likewise discloses a scanning electron microscope illuminating system having a three-stage condenser and a downstream objective. Here, the third condenser lens generates a real image of the crossover in the input image plane of the objective. The focus diameter of the electron beam can be varied by varying the excitations of the two first condenser lenses which operate as a zoom system. The aperture of the illuminating beam is determined by a condenser diaphragm which is mounted either forward or rearward of the input image plane of the objective lens. Furthermore, several embodiments for adjusting Köhler-type illuminating conditions for an electron microscope are described. A multiple diaphragm is mounted in the proximity of the primary plane of the third condenser stage for adjusting an illuminating field which is independent of the illuminating aperture. The diaphragm aperture of the multiple diaphragm is selected with the aid of one or several beam deflectors and determines here the size of the illuminating field on the object. However, the above U.S. Pat. No. 5,013,913 does not disclose whether and in which way such a multiple diaphragm can be used also for an illuminating system wherein an electron beam is focused on the object and the focus diameter is varied via the excitations of the first two condenser lenses.

European patent publication 0,179,294 discloses an ion-optic illuminating system wherein the crossover of the ion source is focused on the object surface via a two-stage imaging system. A multiple diaphragm is mounted between the two imaging stages. A single opening of the multiple aperture can be selected via beam-deflecting systems which are likewise interposed for varying the illuminating aperture. However, in this system, a variation of the focus diameter and the illuminating aperture independently of each other is not possible because, with a change of the lens excitations, a change also takes place simultaneously with respect to the spacing between the multiple diaphragm and the intermediate image plane and therefore the illuminating aperture.

U.S. Pat. No. 5,051,556 discloses an electron-beam lithography system wherein the electron beam is focused on the wafer via a five-stage demagnification system. A mask with a plurality of component fields is mounted in the plane of tile second imaging stage. The selection of the desired mask array takes place by deflecting and thereafter deflecting back the electron beam out of or into the direction of the optical axis. In such lithography systems, the mask, however, does not operate to adjust a specific illuminating aperture; instead, it operates to impress a specific pattern which is thereafter imaged with reduction on the object.

SUMMARY OF THE INVENTION

It is an object of the invention to provide a simple illuminating method and an illuminating system corresponding thereto for illuminating an object with a focused electron beam for which the aperture as well as the focus diameter of the focused electron beam are adjustable independently of each other.

In the illuminating method of the invention, the crossover of the electron source is imaged on the object greatly demagnified via at least four imaging stages. Two of the four imaging stages are operated as a zoom system. The imaging scale of the crossover can be varied in the downstream intermediate image planes and on the object by selecting the excitations of these two imaging stages. In the further course, the electron beam is cropped by a multiple diaphragm to adjust the illuminating aperture. The multiple diaphragm is mounted in the proximity of a main plane of the third imaging stage and has several apertures in a plane which include also off-axis apertures. The apertures of the multiple diaphragm have different sizes. In this way, the aperture of the electron beam can be adjusted independently of the focus diameter which can be varied by the zoom system. This adjustment is made by selecting the desired diaphragm.

The selection of the diaphragm is made without a mechanical displacement of the multiple diaphragm. Instead of a mechanical displacement, the diaphragm selection is made electron-optically with the aid of suitable beam-deflection systems.

In the simplest case, the selection of the diaphragm aperture is made by means of a single deflecting element having a tilt plane which lies in an intermediate image plane of the crossover. With this single deflecting element, it is possible to deflect the electron beam back in the direction of the optical axis with the electron beam being transmitted through an off-axis aperture.

An electron-optical illuminating system according to the invention preferably comprises a radiation source, a condenser having at least three stages and an objective arranged downstream of the condenser. At least two real intermediate image planes of the crossover are present between the first condenser lens and the objective. The two first condenser lenses form a zoom system by means of which an intermediate image of the crossover having a variable imaging scale is generated in a fixed first intermediate image plane. The condenser lenses forming the zoom system face toward the crossover of the radiation source. This first intermediate image plane is at the same time the input image plane of the third condenser lens. The third condenser lens generates a second real intermediate image of the crossover in the input image plane of the objective and the objective images this second intermediate image of the crossover as real on the object. Overall, an image of the crossover is provided on the object which is demagnified in three stages one behind the other.

A multiple diaphragm is mounted between the third condenser stage and the input image plane of the objective and preferably in the main plane of the third stage. The multiple diaphragm has several apertures having different sizes of which some are off-axis. These openings of the multiple diaphragm define aperture diaphragms. The aperture of the electron beam is adjusted by selecting the electron beam transmitted through a single aperture. The multiple diaphragm is mounted perpendicularly to the common optical axis of the four imaging stages and between the third condenser stage and the input image plane of the objective. For this reason, the electron rays which are transmitted through the diaphragm apertures are focused by the action of the third condenser lens on a small common area in the input image plane of the objective independently of the spacing of the affected aperture from the optical axis. For guiding the off-axis electron rays in the direction of the optical axis, only a single deflecting element is therefore provided which has a tilt plane lying in tile input image plane of the objective.

For scanning the object, the deflecting unit is part of a double deflecting system having a common tilt point in the focal plane of the objective.

Rays pass through the last condenser lens inclined to the optical axis for diaphragm apertures of the multiple diaphragm which lie off-axis. For this reason, a stigmator is provided between the input image plane and the main plane of the objective. The stigmator current is selected in dependence upon the beam deflection effected by the first deflecting element.

A mechanically adjustable beam-limiting diaphragm is provided for limiting the region illuminated on the multiple diaphragm. The beam-limiting diaphragm is provided forward of the input image plane of the third condenser stage and preferably in the main plane of the second condenser stage.

In a first embodiment, the diameter of the beam-limiting diaphragm is so selected in size that all openings of the multiple diaphragm are illuminated simultaneously. Additionally, an objective forward-field diaphragm is provided in the forward focal plane of the objective. The objective forward-field diaphragm has an aperture diameter so selected that only the electron beam transmitted through a single aperture of the multiple diaphragm reaches the objective. The electron beams transmitted through the other apertures of the multiple diaphragm are, in contrast, directed to non-transmitting regions of the objective forward-field diaphragm. These electron beams therefore do not contribute to the illumination of the object.

This embodiment affords the advantage that only a single deflecting element is required for the selection of the diaphragm aperture. Accordingly, a total of two deflecting elements is required for the aperture adjustment and for scanning the object. The two deflecting elements are parts of a double deflecting system. The electron current density is constant on the multiple diaphragm so that the maximum electron current is available in the object even when an off-axis diaphragm is selected.

A further advantage of this embodiment is that the beam-limiting diaphragm here has a very large diameter. For this reason, also large-area object illumination can be realized by removing the multiple diaphragm. The large-area object illumination is conventional in transmission electron microscopy. The objective forward-field diaphragm is also not disturbing for scanning operations since the common tilt plane of the double deflecting system is coincident with the plane of the objective forward-field diaphragm. The double deflecting system effects the deflecting movement.

The insertion of an objective forward-field diaphragm is as a rule not possible in scanning electron microscopes wherein the electrons reflected or scattered at the object are detected. In one embodiment suitable for such applications, a beam-limiting diaphragm is provided within the zoom system with a small aperture diameter. The aperture diameter of the beam-limiting diaphragm is matched to the aperture diameter of the multiple diaphragm in such a manner that always only a single aperture is fully illuminated. In this embodiment, an additional deflecting system between the second and the third condenser stage is required with the tilt plane of the deflecting system being in the input image plane of the third condenser stage.

All lenses in both embodiments are configured as magnetic lenses. The excitation currents of the third condenser lens and of the objective lens are adjusted to a fixed value independently of the selected focus diameter of the electron beam on the object and independently of the selected illuminating aperture. In this way, it is ensured that the input and output image planes of the third condenser stage and of the objective lens are always coincident with the tilt planes of the deflection systems.

The aperture diameters of the individual openings in the multiple diaphragm should be so stepped to each other that the stepping factor is less than two and is preferably 1.25. The stepping factor is the ratio of the aperture diameter of one diaphragm to the next larger or next smaller diaphragm.

The electronic control unit for the deflection systems should have a manual aperture selector as well as an automatic aperture selector best adapted to the focus diameter of the electron beam in order that the illuminating system ensures the largest possible flexibility as well as the greatest possible convenience.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
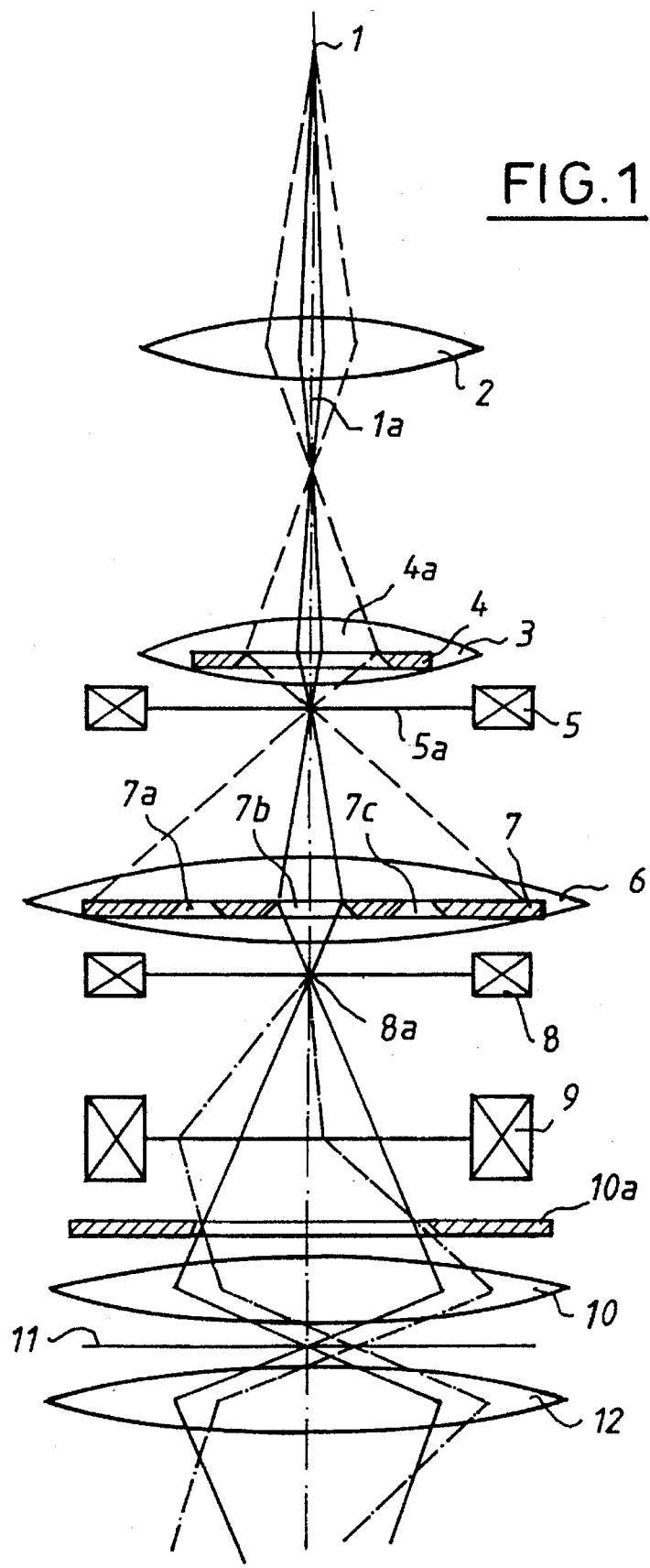
FIG. 1 is a schematic of the beam path of a first embodiment of the invention which is suitable especially for transmission electron microscopy.

The electron-optical illuminating system in FIG. 1 includes an electron source having a crossover identified by reference numeral 1. The crossover conventionally identifies the smallest beam cross section of the beam-generating system. This crossover 1 is imaged into a fixed plane 5a by a condenser zoom system comprising two magnetic lenses (2, 3). The imaging scale at which the crossover 1 is reduced imaged in the intermediate plane 5a can be varied by simultaneously changing the excitation of the lenses 2 and 3. The position of the intermediate image plane 5a, however, then remains fixed.

A third condenser lens 6 is mounted behind the intermediate image plane 5a when viewed in beam direction. This third condenser lens 6 is so excited that its input image plane is likewise coincident with the intermediate image plane 5a. The third condenser lens 6 images the crossover image lying at intermediate image plane 5a once again reduced into a plane 8a which is, at the same time, the input image plane of the objective 10. In this way, a greatly demagnified image of the crossover 1 results in the object plane 11.

The objective 12 of the imaging beam path is shown in FIG. 1 and is necessary for transmission electron microscopic investigations. The objectives (10, 12) can also be configured as objective single-field lens in accordance with Ricke and Ruska.

A multiple diaphragm 7 is mounted in the main plane of the third condenser stage 6. The multiple diaphragm 7 has an axial and six off-axis round apertures having different aperture diameters. Of these seven apertures, only the axial aperture 7b and the off-axis apertures (7a, 7c) are shown in FIG. 1. The axial aperture 7b is disposed symmetrically to the optical axis 1a of the four magnetic lenses (2, 3, 6, 10) of the illuminating system. The six diaphragm apertures are provided in addition to the central aperture and are arranged on a diameter of 300 µm. The smallest aperture diameter is 16 µm and the diameter of the diaphragm apertures increases in each case to the next larger diameter by the factor 1.25. The largest aperture diaphragm has then an aperture diameter of 63 µm. In this way, discretely stepped aperture angles between 5 and 20 mradians are provided for the electron beam in the object plane 11 for a spacing between the multiple diaphragm 7 and the objective input image plane 8a of 30 mm and a demagnification by the objective of 1/18.

A double deflecting system (8, 9) is so arranged between the third condenser lens 6 and the objective 10 that the deflecting plane of the first deflecting element lies in the input image plane 8a of the objective. An excitation of the first deflecting element effects a pure tilting of the electron beam relative to the objective axis 1a. The common tilt point of the total double deflecting system (8, 9) lies at the same time in the forward focal plane 10a at the condenser end. The focal plane 10a is the focal plane of the objective 10. With the aid of the double deflecting system (8, 9), the focused electron beam can be displaced parallelly in the plane of the object 11. The double deflecting system is dynamically driven by a scanning generator (not shown) in the scan mode.

The selection of the particular diaphragm aperture, through which the electron beam is transmitted, takes place here by means of the deflecting unit of the magnetic double deflecting system facing toward the third condenser lens. The electron beam is focused in the object plane 11. A beam-limiting diaphragm 4 is mounted in the main plane of the second condenser lens 3 and has an aperture diameter 4a which is so selected that all apertures (7a to 7c) of the multiple diaphragm 7 are simultaneously illuminated. This is shown in FIG. 1 by the beam trace (shown by the broken line) above the multiple diaphragm 7. The aperture selection essentially takes place with the aid of the upper deflecting element 8 of the double deflecting system (8, 9) together with an objective forward-field diaphragm 10a mounted in the focal plane of the objective 10. The objective forward-field diaphragm 10a has an aperture diameter which is so selected that only that electron beam which is transmitted through one opening (7a, 7c) of the multiple diaphragm 7 transmits the objective forward-field diaphragm 10a. The beams transmitted through the other openings of the multiple diaphragm 7 are deflected to the nontransmitting regions of the objective forward-field diaphragm 10a. For the aperture selection and for the scanning, only a single double deflecting system (8, 9), which simultaneously satisfies both tasks, is required between the third condenser stage 6 and the objective 10. Since during scanning, the tilting takes place in the plane of the objective forward-field diaphragm 10a, no cropping occurs because of the diaphragm. Both deflecting units of the double deflecting system are driven synchronously for the scanning.

An additional deflecting system 5 is mounted between the second condenser lens 3 and the third condenser lens 6. The additional deflecting system 5 is mounted in such a manner that the tilt plane is coincident with the input image plane of the third condenser lens 6. This additional deflecting system makes possible the alignment of the central region of the electron beam on that diaphragm aperture (7a, 7b, 7c) which is just selected for adjusting the aperture.

In this way, negative influences caused by an angle-dependent electron beam can be avoided.

Figure 2:
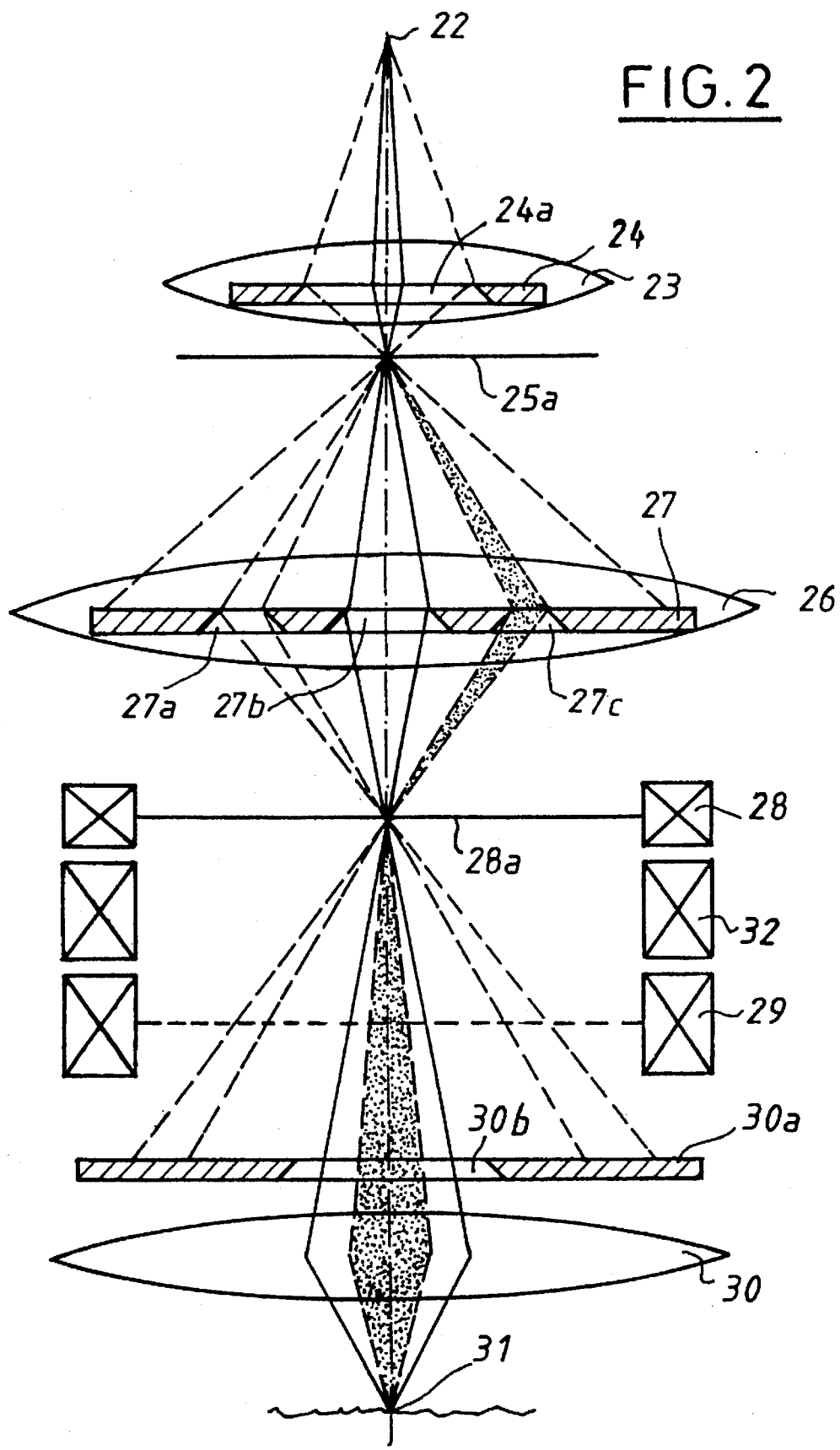
FIG. 2 shows a schematic beam path in the lower portion of the embodiment of FIG. 1 when using an off-axis diaphragm aperture.

A more detailed description of the aperture diaphragm selection will now be provided with reference being made to FIG. 2. For the sake of clarity, the crossover and the first condenser lens are not shown again. Rather, reference numeral 22 identifies the intermediate image of the crossover which occurs within the zoom system. This intermediate image is here shown as a real intermediate image but can be real or virtual in dependence upon the zoom adjustment. The remaining components which correspond to those in FIG. 1 are here identified by reference numerals having a value increased by 20.

The second condenser lens 23 again generates an intermediate image of the crossover which is always real and is in the input image plane 25a of the third condenser lens 26. The aperture 24a of the beam-limiting diaphragm 24 is so selected that all apertures (27a, 27b, 27c) of the multiple diaphragm 27 are illuminated in the main plane of the third condenser lens 26. The electron beams transmitted through all three diaphragm apertures (27a, 27b, 27c) shown here are focused on a common region in the output image plane 28a of the third condenser lens 26 by the imaging characteristics of the third condenser lens 26. The deflecting element 28 is excited without offset for the selection of the central diaphragm aperture 27b. The beam trace of all component beams is therefore continued as a straight line. The electron beams transmitted via off-axis diaphragm openings (27a, 27c) then impinge on the electron nontransmissive region of the objective forward-field diaphragm 30a. These electron beams therefore do not contribute to illuminating the object. Only the electron beam transmitted through the central diaphragm aperture 27b is incident on the aperture 30b of the objective forward-diaphragm 30a and is focused by the objective 30 on the object 31. The component beam which illuminates the object passes centrally through all lenses. For this reason, no off-axis illuminating astigmatism occurs. The stigmator 32 is mounted between the objective 30 and the input image plane 28 thereof. The stigmator comprises two quadrupoles rotated by 45° with respect to each other and, in this case, operates to correct axial astigmatism.

If a change in the aperture is desired, then the first deflecting element 28 of the double deflecting system (28, 29) is provided with an offset so that an electron beam transmitted through an off-axis diaphragm opening 27c can be deflected in a direction toward the optical axis. This is shown in FIG. 2 for the beam transmitted through the aperture 27c. Those component beams which are transmitted through the other apertures (27a, 27b) of the multiple diaphragm are deflected by the same angular amounts. Accordingly, these component beams now impinge on the nontransmitting regions of the objective forward-field diaphragm 30a. A smaller aperture of the focused electron beam results on the object because the opening 27c has a smaller diameter than the opening 27b. In the selection of the off-axis diaphragm apertures (27a, 27c), the corresponding electron beams radiate through the third condenser lens 26 inclined to the optical axis. For this reason, the stigmator 32 in this case serves also to correct the off-axis astigmatism so that a stigmatic image of the crossover occurs on the object 31. Furthermore, a shift offset value is superposed on the double deflection system (28, 29) in dependence upon the position of the selected diaphragm aperture (27a to 27c). Accordingly, deviations of the position of the electron beam focus on the object 31 because of lens or deflection aberrations are avoided. The object can be scanned by corresponding excitation of the double deflection system (28, 29) independently of the selected illumination aperture and the focus diameter on the object 31 adjusted by the zoom system.

Figure 3:
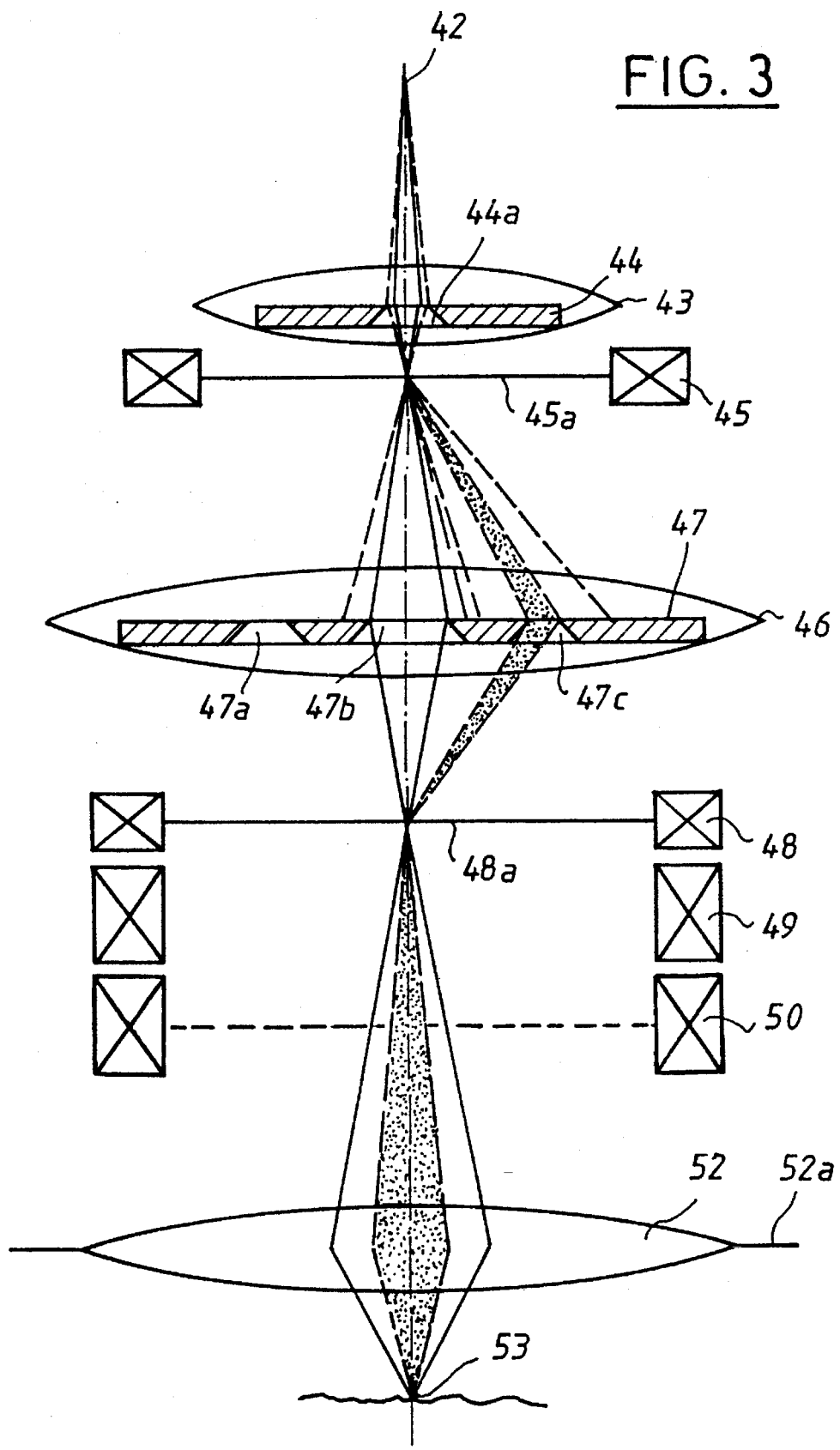
FIG. 3 shows a schematic beam path of a second embodiment of the invention suitable especially for surface scanning electron microscopes; and, FIG. 4 is a circuit block diagram of the drive circuit for the embodiments shown in FIGS. 1 to 3.

The lower region of a second embodiment is shown in FIG. 3 and this embodiment is adequate without an objective forward-field diaphragm. The crossover and the first lens of the zoom system are again not shown here. Rather, reference numeral 42 identifies the real or virtual intermediate image of the crossover lying within the zoom system. The second condenser lens 43 always forms this intermediate image as real in the input image plane 45a of the third condenser lens 46. The diameter of the crossover image is variable in the plane 45a by varying the focal lengths of the first condenser lens (not shown) and the second condenser lens 43. The third condenser lens 46 again generates a second real intermediate image of the crossover in the input image plane 48a of the objective lens 52 which finally generates a greatly demagnified electron beam focus on the object 53. In this embodiment too, a multiple diaphragm 47 is mounted in the main plane of the third condenser lens 46. This multiple diaphragm 47 has a central aperture 47b and off-axis apertures (47a, 47c). These diaphragm apertures (47a to 47c) again operate as aperture diaphragms.

In contrast to the embodiment described above, the beam-limiting diaphragm 44 mounted in the main plane of the second condenser lens 43 has only a small aperture 44a. The diameter of this aperture 44a is so selected that only a single aperture of the multiple diaphragm 47 is illuminated. A condenser deflecting system 45 is required here for selecting the desired aperture diaphragm. This condenser deflecting system effects a deflection of the electron beam when excited. The tilt plane is coincident with the input image plane of the third condenser stage 46. This deflection has no influence on the position of the crossover image in the second intermediate image plane 48a because this deflection takes place about the input image plane of the third condenser lens 46. The back deflection of the electron beams, which are transmitted through off-axis of the multiple diaphragm 47, again takes place by means of the first element of a magnetic double deflection system (48, 50). This double deflection system (48, 50) operates here too for scanning the electron beam focus. The arrangement of the double deflection system (48, 50) is such that the input image plane 48a of the objective lies in the tilt plane of the first deflection element 48 and the common tilt plane of the entire double deflection system (48, 50) lies in the main plane 52a of the objective 52. In this way, for fixed tilt planes, a variation of the work distance and the focal length change of the objective 52 required for this purpose is possible. Off-axis astigmatism is generated when using off-axis diaphragm apertures (47a, 47c) because of the beam trace within the third condenser lens 46 which is inclined to the optical axis. This astigmatism is again corrected by a stigmator 49 mounted forward of the objective lens 52.

FIG. 4 shows a block circuit diagram for driving the electron-optical components with respect to their aperture selection. The desired diameter of the electron beam focus in the object plane can be inputted via a keypad 62. This keypad is connected to a control unit 74 for the zoom system. The control unit 74, in turn, drives the current supply 75 for the first condenser lens 2 and a second supply unit 76 for the second condenser lens 3. Furthermore, a second keypad 60 is provided for manually inputting the desired probe aperture, that is, the radiation or illumination aperture. Furthermore, a selection can be made via switch 61 as to whether this aperture should be optimally adapted automatically in correspondence to the selected focus diameter or should be adjusted to the value inputted via the keypad 60. An aperture-control unit 63 generates a first output signal which drives the current supply 77 for the condenser-deflecting system 5. A second output signal of the aperture-control unit 63 is supplied to a control unit 66 for driving the current supply 67 of the third condenser lens 6. The control unit 66 causes the current supply unit 67 to approximate the current of the third condenser stage 6 to the work current in accordance with a defined procedure which is here, for example, the work current is always approximated from the high current side. In this way, focus errors because of the remnance of the magnetic lens 6 are avoided.

The aperture-control unit 63 generates two further output signals. The first further output signal is for the double deflecting control unit 64 and the second further output signal is for the stigmator control unit 68. A switch on a control unit 65 is provided for activating the scanning operation. The double deflecting control unit 64 connects the static values for the beam shift and the beam inclination which are inputted by means of digital encoders (74a, 74b) with the offset values for the selected illumination aperture and controls of the separate current supplies (70, 71) for the two deflecting units (8, 9) of the double deflection system. During scanning operation, two tooth-shaped deflecting currents are superposed in addition. The stigmator-control unit 68 controls the stigmator-current supply 69 in dependence upon the preselected aperture. The current supply 69 is for the stigmators (32, 49) for correcting the axial or off-axis astigmatism. Manually inputted stigmator values can be superposed on these aperture-adapted stigmator values via two stigmator rotation transducers (75a, 75b). The stigmator rotation transducers can also be used in another operating mode for manually inputting aperture-adapted stigmator values.

It is understood that the foregoing description is that of the preferred embodiments of the invention and that various changes and modifications may be made thereto without departing from the spirit and scope of the invention as defined in the appended claims.

What is claimed is:

1. A method of illuminating an object with a focused electron beam utilizing an electron-optical illuminating system including an electron source defining a crossover and at least first, second, third and fourth imaging lens stages which can be excited, the electron beam having a focus diameter and an illuminating aperture and said four imaging lens stages defining an optical axis, the method comprising the steps of:

utilizing said four imaging lens stages to image said crossover demagnified on the object;

changing the demagnification of said crossover a pregiven amount by selectively adjusting the excitation of the first and second ones of said imaging lens stages thereby adjusting said focus diameter of said electron beam;

providing a multiple diaphragm having a plurality of apertures of which at least a portion are off-axis apertures;

exciting said first and second imaging lens stages to direct said electron beam to at least one of said off-axis apertures;

positioning said multiple diaphragm in the immediate vicinity of the main plane of the third one of said imaging lens stages so as to cause the electron beam transmitted through said at least one of said off-axis apertures to be deflected back to the optical axis by only said third imaging lens stage; and, cropping said electron beam with said multiple diaphragm to adjust said illuminating aperture of the electron beam independently of the adjustment of said focus diameter.

2. The method of claim 1, said system having a deflecting element and the method further comprising the steps of:

transmitting said electron beam through a single one of said off-axis apertures thereby deflecting said electron beam away from said optical axis;

utilizing said third imaging lens stage to image said crossover into an intermediate image plane of said crossover; and, utilizing said deflecting element to deflect said electron beam back to said optical axis with said deflecting element having a tilt plane in said intermediate image plane.

3. The method of claim 2, said system including a double deflecting device which includes said deflecting element as a first deflecting element and a second deflecting element, the method further comprising scanning the object with said electron beam by exciting both of said deflecting elements in common.

4. The method of claim 1, said system having two deflecting elements and a stigmator arranged between said deflecting elements, the method further comprising:

transmitting said electron beam through a single one of said off-axis apertures thereby deflecting said electron beam away from said optical axis;

energizing said deflecting elements to deflect said electron beam back to said optical axis so as to cause said electron beam to pass through said stigmator; and, selecting the excitation of said stigmator in correspondence to the back deflection effected by said deflecting elements.

5. The electron-optical illuminating system of claim 1, said apertures of said multiple diaphragm each having a diameter less than 100 μm.

6. The electron-optical illuminating system of claim 5, said apertures of said multiple diaphragm having respective aperture diameters which are stepped one to the other so that the ratio of the aperture diameter of one diaphragm to the aperture diameter of the next largest or next smallest diaphragm is less than two.

7. An electron-optical illuminating system defining an optical axis, said system comprising:

an electron source for supplying an electron beam defining a crossover on said optical axis;

said electron beam having a focus diameter and an illuminating aperture;

a three-stage condenser having first, second and third imaging lens stages arranged on said optical axis;

an objective having an input image plane and an output image plane and being arranged on said axis downstream of said image lens stages;

said third imaging lens stage being disposed downstream of said first and second imaging lens stages and defining both a main plane and an input image plane;

a multiple diaphragm having a plurality of off-axis apertures of different sizes;

first excitation means connected to said first and second imaging lens stages for generating a first intermediate image of said crossover in said input image plane with a variable imaging scale while adjusting said focus diameter and so as to direct said electron beam to at least one of said off-axis apertures thereby cropping said electron beam to adjust said illuminating aperture of said electron beam independently of the adjustment of said focus diameter;

second excitation means connected to said third imaging lens stage for imaging said intermediate image of said crossover into said input image plane of said objective;

said multiple diaphragm being disposed in the immediate vicinity of said main plane so as to cause said electron beam transmitted through said at least one of said off-axis apertures to be deflected back to said optical axis by only said third imaging lens stage; and, third excitation means for energizing said objective so as to cause said objective to coact with said first, second and third imaging lens stages to cause said crossover to be imaged demagnified on an object.

8. The electron-optical illuminating system of claim 7, further comprising a first deflecting element having a tilt plane in said input image plane of said objective.

9. The electron-optical illuminating system of claim 8, said objective defining a focal plane and said system further comprising a second deflecting element downstream of said first deflecting element; and, said first and second deflecting elements conjointly defining a common tilt plane disposed in said focal plane.

10. The electron-optical illuminating system of claim 9, further comprising a stigmator arranged between said objective and said input image plane thereof.

11. The electron-optical illuminating system of claim 10, further comprising a beam-limiting diaphragm arranged upstream of said input image plane of said third imaging lens stage.

12. The electron-optical illuminating system of claim 11, said beam-limiting diaphragm defining an aperture having an aperture diameter which is selected so as to cause all of said apertures of said multiple diaphragm to be simultaneously illuminated; and, said system further comprising an objective forward field diaphragm arranged in said focal plane of said objective for selecting an electron beam transmitted through a single aperture of said multiple diaphragm.

13. The electron-optical illuminating system of claim 11, said beam-limiting diaphragm defining an aperture having a diameter selected so as to cause only one of said apertures of said multiple diaphragm to be always illuminated; and, said system further comprising a condenser deflecting element having a tilt plane disposed in said input image plane of said third condenser imaging lens stage.

14. The electron-optical illuminating system of claim 10, further comprising electronic stigmator control means for supplying current to said stigmator in dependence upon the beam deflection effected by said first deflecting element.

15. The electron-optical illuminating system of claim 7, said system further comprising switch means for selectively manually or automatically selecting an aperture of the multiple diaphragm with said aperture being adapted to the diameter of the crossover image when the selection is made automatically.

* * * * *